(12) United States Patent
Kurz et al.

(10) Patent No.: US 8,486,768 B2
(45) Date of Patent: Jul. 16, 2013

(54) SEMICONDUCTOR DEVICE COMPRISING HIGH-K METAL GATE ELECTRODE STRUCTURES AND PRECISION EFUSES FORMED IN THE ACTIVE SEMICONDUCTOR MATERIAL

(75) Inventors: Andreas Kurz, Dresden (DE); Stephan Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 84 days.

(21) Appl. No.: 13/114,116

(22) Filed: May 24, 2011

(65) Prior Publication Data

US 2012/0001295 A1  Jan. 5, 2012

(30) Foreign Application Priority Data

Jun. 30, 2010 (DE) .......................... 10 2010 030 765

(51) Int. Cl.
*H01L 21/82* (2006.01)
(52) U.S. Cl.
USPC ............... 438/132; 257/529; 257/E23.141; 257/E21.09; 438/601

(58) Field of Classification Search
USPC .......... 438/381, 132, 601; 257/529, E23.141, 257/E21.09
See application file for complete search history.

(56) References Cited

U.S. PATENT DOCUMENTS

| 7,244,958 | B2 | 7/2007 | Shang et al. |
| 2008/0067629 | A1 | 3/2008 | Miyashita |
| 2009/0309184 | A1 | 12/2009 | Kim et al. |

OTHER PUBLICATIONS

Translation of Official Communication from German Patent Application 10 2010 030 765.3-33 dated Mar. 21, 2011.

*Primary Examiner* — Julio J Maldonado
*Assistant Examiner* — Amar Movva
(74) *Attorney, Agent, or Firm* — Williams, Morgan & Amerson, P.C.

(57) ABSTRACT

In a complex semiconductor device, electronic fuses may be formed in the active semiconductor material by using a semiconductor material of reduced heat conductivity selectively in the fuse body, wherein, in some illustrative embodiments, the fuse body may be delineated by a non-silicided semiconductor base material.

20 Claims, 5 Drawing Sheets

SEMICONDUCTOR DEVICE COMPRISING HIGH-K METAL GATE ELECTRODE STRUCTURES AND PRECISION EFUSES FORMED IN THE ACTIVE SEMICONDUCTOR MATERIAL

BACKGROUND OF THE INVENTION

1. Field of the Invention

The present disclosure generally relates to the field of fabricating integrated circuits, and, more particularly, to forming electronic fuses for providing device internal programming capabilities in complex integrated circuits.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance. In addition to the large number of transistor elements, a plurality of passive circuit elements, such as capacitors, resistors and the like, are typically formed in integrated circuits that are used for a plurality of purposes.

Due to the decreased dimensions of circuit elements, not only the performance of the individual transistor elements may be improved, but also their packing density may be increased, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

In such modern integrated circuits, minimal features sizes have now reached approximately 50 nm and less, thereby providing the possibility of incorporating various functional circuit portions at a given chip area, wherein, however, the various circuit portions may have a significantly different performance, for instance with respect to lifetime, reliability and the like. For example, the operating speed of a digital circuit portion, such as a CPU core and the like, may depend on the configuration of the individual transistor elements and also on the characteristics of the metallization system, which may include a plurality of stacked metallization layers so as to comply with a required complex circuit layout. Thus, highly sophisticated manufacturing techniques may be required in order to provide the minimum critical feature sizes of the speed critical circuit components. For example, sophisticated digital circuitry may be used on the basis of field effect transistors which represent circuit components in which the conductivity of a channel region is controlled by a gate electrode that is separated from the channel region by a thin dielectric material. Performance of the individual field effect transistors is determined by, among other things, the capability of the transistor to switch from a high impedance state into a low impedance state at high speeds, wherein a sufficiently high current may also have to be driven in the low impedance state. This drive current capability is determined by, among other things, the length of the conductive channel that forms in the channel region upon application of an appropriate control voltage to the gate electrode. For this reason, and in view of the demand for increasing the overall packing density of sophisticated semiconductor devices, the channel length, and thus the length of the gate electrode, is continuously being reduced, which in turn may require an appropriate adaptation of the capacitive coupling of the gate electrode to the channel region. Consequently, the thickness of the gate dielectric material may also have to be reduced in order to maintain controllability of the conductive channel at a desired high level. However, the shrinkage of the gate dielectric thickness may be associated with an exponential increase of the leakage currents, which may directly tunnel through the thin gate dielectric material, thereby contributing to enhanced power consumption and thus waste heat, which may contribute to sophisticated conditions during operation of the semiconductor device. Moreover, charge carriers may be injected into the gate dielectric material and may also contribute to a significant degradation of transistor characteristics, such as threshold voltage of the transistors, thereby also contributing to pronounced variability of the transistor characteristics over the lifetime of the product. Consequently, reliability and performance of certain sophisticated circuit portions may be determined by material characteristics and process techniques for forming highly sophisticated circuit elements, while other circuit portions may include less critical devices, which may thus provide a different behavior over the lifetime compared to critical circuit portions. Consequently, the combination of the various circuit portions in a single semiconductor device may result in a significantly different behavior with respect to performance and reliability, wherein the variations of the overall manufacturing process flow may also contribute to a further discrepancy between the various circuit portions.

For these reasons, in complex integrated circuits, frequently, additional mechanisms may be implemented so as to allow the circuit itself to adapt performance of certain circuit portions to comply with performance of other circuit portions, for instance upon completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, resetting overall circuit speed and the like.

For this purpose, so-called electronic fuses, or e-fuses, may be provided in the semiconductor devices, which may represent electronic switches that may be activated once in order to provide a desired circuit adaptation. Hence, the electronic fuses may be considered as having a high impedance state, which may typically also represent a "programmed" state, and may have a low impedance state, typically representing a non-programmed state of the electronic fuse. Since these electronic fuses may have a significant influence on the overall behavior of the entire integrated circuit, a reliable detection of the non-programmed and the programmed state may have to be guaranteed, which may have to be accomplished on the basis of appropriately designed logic circuitry. Furthermore, since typically these electronic fuses may be actuated once over the lifetime of the semiconductor device under consideration, a corresponding programming activity may have to ensure that a desired programmed state of the electronic fuse is reliably generated in order to provide well-defined conditions for the further operational lifetime of the device.

For these reasons, appropriate mechanisms have been established so as to provide electronic fuses that may be programmed in a reliable manner. The programming of electronic fuses may rely on a degradation mechanism of a conductive material wherein, upon applying a current pulse, an irreversible change of the electronic characteristics of the electronic fuse may result in a reliably detectable programming status of the electronic fuse. To this end, electromigration, typically a non-desired effect in semiconductor devices, may be taken advantage of in order to provide a mechanism for permanently damaging the conductive line and thus achieving a detectable high impedance state. Electromigration is a phenomenon that can be observed in conductors, in which a sufficiently high current density may be established such that the collective movement of electrons in the conductor material may result in a material migration caused by the momentum transfer from the electrons to the atoms or ions of the material. Electromigration can typically be observed in conductor lines of semiconductor devices in which the conductive lines are embedded in a dielectric material that provides sufficient heat dissipation capability, thereby enabling very high current densities before excessive heat in the conductive line may result in irreversible damage, as may typically be observed in isolated conductors. Thus, although embedding the conductive lines in dielectric materials may allow operation of the semiconductor devices with high current densities, the material migration in the conductive lines caused by the momentum transfer of electrons may finally result in a degradation and thus failure of the conductive line during the operational lifetime of the semiconductor device. For this reason, electromigration effects in metallization systems of semiconductor devices are carefully studied and monitored in order to estimate performance and reliability of complex semiconductor devices. Electromigration, on the other hand, may be efficiently used in electronic fuses in order to intentionally initiate a degradation of a conductive line or fuse body so as to obtain a detectable high impedance state. To this end, the electromigration in metal silicide materials formed in silicon-based materials, such as polysilicon materials, may be efficiently used for providing electronic fuses in the device level of semiconductor devices, wherein the overall lateral dimensions and the material composition of the basic semiconductor material, in combination with the characteristics of the metal silicide, may thus have a significant influence on the overall performance of a corresponding electronic fuse. To this end, in addition to appropriate designs and layouts of corresponding electronic fuses based on silicon material and metal silicide, appropriate peripheral circuitry has also been developed, for instance in the form of transistor elements for driving the required current pulse through the electronic fuse so as to "blow" the fuse upon programming the electronic fuse, wherein the current drive capability of the transistor or transistors, and thus the size thereof, may have to be adapted to the current density required for programming the electronic fuse.

Upon further reducing the overall dimensions of circuit elements in sophisticated semiconductor devices, the gate length of field effect transistors is also reduced, which represents one important circuit element in complex semiconductor devices, thereby requiring efficient mechanisms for controlling the current flow in the channel region of the field effect transistors, as discussed above. Conventionally, electrode structures may be provided on the basis of a polysilicon material in combination with a metal silicide formed therein, which may be provided on an appropriate gate dielectric material, such as silicon dioxide, which separates the gate electrode from the channel region. In order to provide a very efficient overall manufacturing process flow, the electronic fuses may be formed together with the gate electrode structures of the transistors, since, as discussed above, polysilicon in combination with a metal silicide may provide an efficient mechanism for electronic fuses. With the introduction of gate lengths of 40 nm and less, however, it turns out that conventional gate electrode structures based on polysilicon, in combination with conventional gate dielectrics, such as silicon dioxide, silicon oxynitride and the like, may no longer be sufficient for appropriately controlling the channel in sophisticated field effect transistors. For this reason, conventional gate dielectric materials may be replaced, at least partially, by so-called high-k dielectric materials, i.e., dielectric materials having a dielectric constant of 10.0 or higher, in order to provide sufficient capacitive coupling of the gate electrode to the channel region without further increasing the resulting gate leakage currents. Concurrently, the polysilicon material may be replaced by a material of superior conductivity, which may also significantly reduce or avoid the creation of a depletion zone in the vicinity of the gate dielectric material. Consequently, a plurality of manufacturing strategies have been developed, one of which may be referred to as a gate replacement approach. In this very promising manufacturing technique, the gate electrode structure may initially be formed on the basis of polysilicon in combination with a conventional gate dielectric material or on the basis of a high-k dielectric material and the processing may be continued by completing the basic transistor configuration, i.e., forming drain and source regions and the like. In a very advanced manufacturing stage, the gate electrode structures may be embedded in a dielectric material and the polysilicon material may be removed by appropriate selective etch strategies. Thereafter, any appropriate metal species may be formed in the resulting gate openings in order to adjust the appropriate gate characteristics in terms of work function, conductivity and the like.

Although this manufacturing strategy may provide superior field effect transistors having high-k metal gate electrode structures, at the same time, the polysilicon material of non-transistor elements may be removed, such as the semiconductor material of the electronic fuses, which is then replaced by a highly conductive electrode metal, thereby, however, significantly changing the overall electronic behavior of the electronic fuses. That is, due to the superior conductivity, increased current densities may be required, which in turn may be associated with the provision of transistors of significantly increased size in order to provide the required high current values. On the other hand, reducing the overall lateral dimensions of the electronic fuses may be less than desirable, since typically it is extremely difficult to further reduce the critical dimensions in the device level on the basis of given lithography and patterning abilities of the circuit design under consideration.

In view of this situation, other strategies have been developed, such as providing the electronic fuses in the metallization system of the semiconductor device, which, however, may suffer from similar problems with respect to the required high current densities, due to the superior conductivity of the metal lines and vias in the metallization system of sophisticated semiconductor devices. In other approaches, electronic fuses may be formed in the active semiconductor layer, i.e., in the crystalline semiconductor material, in which the drain and source regions of the transistor elements may also be provided. In this manner, the gate replacement approach does not interfere with the electronic characteristics of the electronic fuses formed in the active semiconductor layer, wherein, however, it has been observed that corresponding electronic fuses may not efficiently operate in "bulk" configurations, that is, in semiconductor devices in which the active semiconductor material may be formed directly on the crystalline semiconductor material of the substrate without providing a buried insulating material, as is the case in an SOI (silicon-on-insulator) configuration.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which semiconductor-based electronic fuses may be provided in the active semiconductor material of a bulk device, i.e., a semiconductor device that may initially not comprise a buried insulating material, wherein the electronic fuse may comprise a fuse body formed on the basis of silicon-containing semiconductor material having a reduced heat conductivity compared to the semiconductor base material. Thus, the contact regions of the electronic fuse may be formed in the semiconductor base material so as to provide superior heat conductivity and current drive capability, while, on the other hand, the fuse body, i.e., the fuse area, in which a significant electromigration effect is to be induced may be formed with an efficient thermal decoupling from the semiconductor base material of the bulk device. To this end, in some embodiments disclosed herein, a portion of the semiconductor base material, for instance provided in the form of a silicon material, may be replaced by a semiconductor mixture, such a silicon/germanium mixture, which may have a significantly reduced heat conductivity compared to the silicon base material. Moreover, the semiconductor material of reduced heat conductivity, which may thus provide efficient thermal decoupling of the fuse body from the crystalline substrate material of the semiconductor device, may also provide a reduced silicidation rate upon forming a metal silicide, which may thus also efficiently reduce the amount of metal silicide material in the fuse body, thereby achieving increased electromigration on the basis of reduced current densities therein, while, on the other hand, a high desired drive current capability may be preserved in the contact regions of the electronic fuse, which may comprise the semiconductor base material in combination with a desired metal silicide thickness.

In some illustrative embodiments disclosed herein, the uniformity of the metal silicide thickness and the fuse bodies of the electronic fuses may be enhanced by providing superior deposition conditions upon depositing the silicon-containing semiconductor material within a recess formed in the semiconductor base material so as to incorporate the replacement semiconductor material having the reduced heat conductivity. To this end, delineation portions of the semiconductor base material may be preserved so as to form sidewalls of the recess or cavities, which may thus provide superior deposition conditions and thus superior uniformity of the resulting surface of the replacement semiconductor material upon growing the material in the recess. Consequently, the subsequent processes, for instance for forming the metal silicide in the fuse body, may be continued with superior process conditions and thus uniformity of the resulting metal silicide.

Consequently, by using a semiconductor material of reduced heat conductivity and/or reduced silicidation rate within the fuse body of an electronic fuse in a bulk semiconductor device, electronic fuses may be provided in the device level of sophisticated semiconductor devices with similar characteristics and lateral dimensions compared to polysilicon electronic fuses, while, at the same time, superior flexibility is provided with respect to providing sophisticated transistors, which may comprise sophisticated gate electrode structures formed on the basis of a high-k dielectric material in combination with a metal-containing electrode material.

One illustrative method disclosed herein relates to forming an electronic fuse of a semiconductor device. The method comprises forming a fuse body of the electronic fuse by replacing a portion of a first semiconductor material with a second semiconductor material, wherein the first semiconductor material forms a bulk configuration with a substrate material of the semiconductor device. Moreover, the first semiconductor material has a first heat conductivity that is greater than a second heat conductivity of the second semiconductor material. The method further comprises forming a contact region of the electronic fuse laterally adjacent to and in contact with the fuse body and the first semiconductor material. Moreover, the method comprises forming a metal silicide material of the fuse body locally restricted in the second semiconductor material.

A further illustrative method disclosed herein relates to forming a semiconductor device. The method comprises forming an isolation structure in a semiconductor base material so as to laterally delineate a first contact region and a second contact region of an electronic fuse in the semiconductor base material. The semiconductor base material forms a bulk configuration with a substrate material of the semiconductor device. Additionally, the method comprises forming a recess in the semiconductor base material between the first and second contact regions. The method further comprises forming a silicon-containing semiconductor material in the recess, which has a reduced heat conductivity compared to the semiconductor base material. Moreover, the method comprises forming a metal silicide material in the first and second contact regions and in the silicon-containing semiconductor material.

One illustrative semiconductor device disclosed herein comprises first and second contact regions of an electronic fuse that are formed in a semiconductor base material and that are laterally delineated in the semiconductor base material by an isolation structure. The semiconductor base material has a first heat conductivity and forms a bulk configuration with a crystalline substrate material of the semiconductor device. The semiconductor device further comprises a fuse body in contact with the first and second contact regions and comprising a silicon-containing semiconductor material having a second heat conductivity that is less than the first heat conductivity. Furthermore, the semiconductor device comprises delineation regions comprised of the semiconductor base material and formed laterally adjacent to the fuse body so as to laterally enclose the fuse body. Additionally, the semiconductor device comprises a metal silicide formed selectively in the first and second contact regions and in the silicon-containing semiconductor material of the fuse body.

BRIEF DESCRIPTION OF THE DRAWINGS

The disclosure may be understood by reference to the following description taken in conjunction with the accompanying drawings, in which like reference numerals identify like elements, and in which.

Figure 1A:
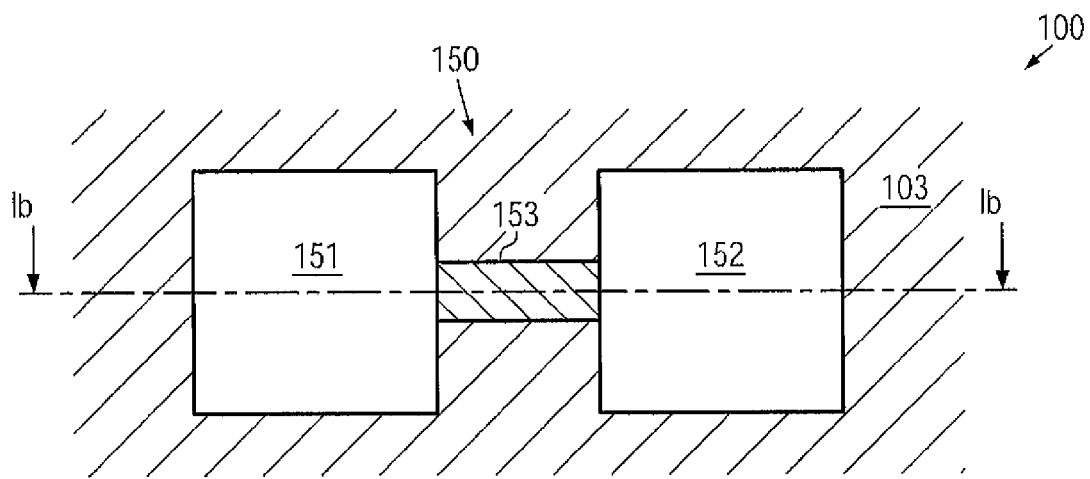
FIG. 1a schematically illustrates a top view of a semiconductor device comprising an electronic fuse formed on the basis of a fuse body comprising a semiconductor material of reduced heat conductivity, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which an electronic fuse may be efficiently provided in the active semiconductor material of a bulk device, i.e., of a semiconductor device, without requiring a buried insulating material, wherein the overall lateral dimensions of the electronic fuse and the required current density for reliably initiating a programming event may be similar to polysilicon-based electronic fuses. To this end, a semiconductor material of reduced heat conductivity may be provided in the fuse body of the electronic fuse so that the current flow may be subsequently established within a metal semiconductor compound, such as metal silicide formed in the semiconductor material of reduced heat conductivity. Consequently, any heat generated during the programming event may be dissipated into the depth of the crystalline substrate with significantly reduced efficiency due to the reduced heat conductivity of the replacement semiconductor material, thereby providing similar thermal conditions, as in SOI (silicon-on-insulator) configurations. Furthermore, in some illustrative embodiments disclosed herein, the semiconductor material of reduced heat conductivity may also provide a reduced silicidation rate, thereby also efficiently reducing the amount of metal silicide material that is present in the fuse body, thereby also providing superior programming reliability, since the amount of metal silicide to be diffused during an electromigration event may be reduced.

In some illustrative embodiments, the semiconductor material of reduced heat conductivity may be provided by forming a recess or cavity in the semiconductor base material, such a silicon material, wherein superior robustness with respect to process non-uniformities may be achieved by laterally delineating the fuse body by the semiconductor base material rather than by an isolation structure so that superior deposition uniformity during the deposition of the replacement semiconductor material may result in a uniform semiconductor surface, thereby compensating for any process non-uniformities caused during the cavity etch process, the subsequent silicidation process and the like. On the other hand, the formation of the metal silicide in the fuse body may be laterally restricted to the replacement semiconductor material having the reduced heat conductivity by appropriately masking the sidewall portions or delineation regions when performing the silicidation process. Consequently, the contact regions of the electronic fuse may be formed on the basis of any appropriate lateral dimensions within the semiconductor base material, wherein the standard silicide material may provide superior current drive capability. On the other hand, in the fuse body, in which the significant silicide electromigration is to be initiated, the reduced heat conductivity may result in superior thermal conditions for supporting enhanced electromigration, while at the same time the reduced amount of metal silicide formed therein may also contribute to superior programming reliability, wherein, if provided, the additional sidewall portions or delineation regions may generally provide superior characteristics of the resulting metal silicide, thereby allowing a reduced process window for effecting a programming event, since, for instance, reduced current densities may be used, while nevertheless obtaining a reliable programmed state for a given layout of the electronic fuse.

Therefore, the electronic fuses may be advantageously applied in any bulk devices with superior flexibility in selecting appropriate characteristics of other circuit elements, such as complex field effect transistors. For example, as previously discussed, in sophisticated semiconductor devices, field effect transistors have to be provided with superior gate electrode structures comprising high-K dielectric material in combination with metal-containing electrode material. To this end, a plurality of process strategies have been developed, such as complex techniques, in which the high-K dielectric material and the metal-containing electrode material may be provided in an early manufacturing stage or in a very late manufacturing stage, wherein both approaches may typically affect well-established strategies for providing polysilicon-based electronic fuses. Thus, by implementing semiconductor-based electronic fuses into the active semiconductor material for bulk semiconductor devices, this device architecture may be efficiently used for sophisticated field effect transistors including high-K metal gate electrode structures, irrespective of the process strategy used for forming these sophisticated gate electrode structures.

FIG. 1a schematically illustrates a top view of a semiconductor device 100, which comprises an electronic fuse 150. The electronic fuse 150 may be generally laterally delineated by an isolation structure 103, such a shallow trench isolation, which may typically be formed in a semiconductor base material on the basis of any appropriate dielectric material, such as silicon dioxide, silicon nitride and the like. The electronic fuse 150 may comprise a first contact region 151, which may, in the manufacturing stage shown, be substantially comprised of a semiconductor base material, as will be described in more detailed with reference to FIG. 1b. Similarly, a second contact region 152 may be provided, wherein the contact regions 151, 152 may have any desired lateral dimensions so as to provide the required drive current capabilities in combination with any contact elements that are to be formed in a later manufacturing stage. The electronic fuse 150 may further comprise a fuse body 153, which represents basically the area where a significant degree of line degradation caused by electromigration may be initiated in order to "program" the electronic fuse 150 into a high ohmic state, as is also previously discussed. The fuse body 153 may thus be provided with appropriate lateral dimensions, which may be selected so as to achieve a sufficiently pronounced line degradation within a short time interval, for instance within several micro seconds and the like. In the embodiment shown in FIG. 1a, the fuse body 153 may be laterally delineated by the isolation structure 103 and may comprise a semiconductor material of reduced heat conductivity, as will be described later on in more detail, which may thus provide superior thermal decoupling of the fuse body 153 with respect to the semiconductor base material of the device 100.

It should be appreciated that generally the layout of the electronic fuse 150 i.e., of the contact regions 151, 152 and of the fuse body 153, may be selected in view of any layout criteria, such as area consumption in the device 100 and the like, wherein the provision of a semiconductor material of reduced heat conductivity in the fuse body 153 may provide the possibility of generally reducing the overall lateral dimensions of the electronic fuse 150, while nevertheless preserving a high degree of reliability for generating a pronounced electromigration effect for a given current density. It should be appreciated, for example, that without providing a semiconductor material of reduced heat conductivity, significantly higher current densities would be required in order to achieve a reliable electromigration effect, which would then require an increased length of fuse body 153 and/or a significantly increased size of corresponding drive transistors that have to supply the current to the electronic fuse 150 upon initiating the programming of the electronic fuse 150.

Figure 1B:
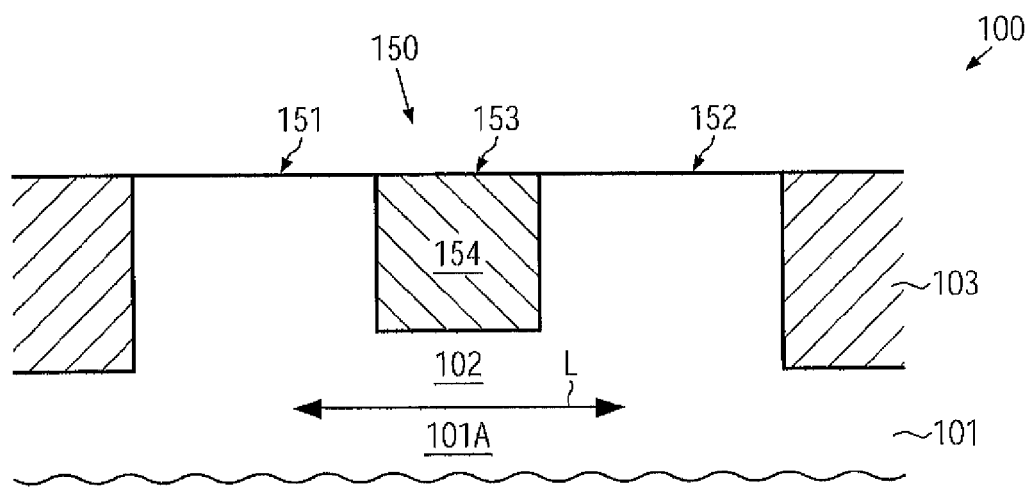
FIG. 1b schematically illustrates a cross-sectional view, along the line Ib of FIG. 1a, in a manufacture stage in which contact regions are formed in a semiconductor base material and may connect to the fuse body comprising the semiconductor material of reduced heat conductivity, according to illustrative embodiments.

FIG. 1b schematically illustrates a cross-sectional view of the device 100 along the line Ib of FIG. 1a. As illustrated, the device 100 may comprise a substrate 101, which may represent any appropriate carrier material, such as silicon material and the like, wherein at least a portion of the substrate 101 may comprise a crystalline semiconductor material 101A, which may also be referred to as substrate material and which, in combination with a semiconductor layer 102, which may also be referred to as semiconductor base material, may thus form a "bulk" configuration, at least in an initial state. That is, the semiconductor base material 102 directly connects, in a mechanical sense, to the crystalline substrate 101A, while a corresponding electrical separation, if required, may be achieved on the basis of an appropriate dopant profile in the semiconductor base material 102. Consequently, in a bulk configuration, the semiconductor base material 102 is thermally efficiently coupled to the crystalline semiconductor material 101A and thus to the substrate 101, which may provide superior performance with respect to heat dissipation in sophisticated semiconductor devices. On the other hand, the efficient thermal coupling between the semiconductor base material 102 and the substrate 101A may be highly disadvantageous for the electronic fuse 150, since significantly higher current densities would be required for inducing a desired degree of electromigration. Consequently, the fuse body 153 may comprise a semiconductor material 154 having the reduced heat conductivity compared to the semiconductor base material 102. That is, the semiconductor material 154 having the reduced heat conductivity may be formed within the semiconductor layer 102 so as to extend from a surface thereof to a certain depth in order to efficiently increase the "vertical" thermal resistance of the fuse body 153. In some illustrative embodiments disclosed herein, the semiconductor material 154 may be provided in the form of a silicon/germanium mixture or alloy, which may comprise 15-35 atomic percent of germanium. For example, the heat conductivity of a silicon/germanium crystalline material with a germanium concentration of the above-specified range may be approximately 60 W/m K, while, for instance, a substantially pure silicon material may have a heat conductivity of approximately 150 W/m K.

Consequently, as shown in FIG. 1b, in a length direction, indicated as L, the fuse body 153, and thus the semiconductor material 154, may connect to the contact regions 151,152, which are comprised of the semiconductor base material 102, while, in a width direction, i.e., in the direction perpendicular to the drawing plane of FIG. 1b, the material 154 may be delineated by the isolation structure 103, as is, for instance, shown in FIG. 1a.

The semiconductor device 100 as illustrated in FIGS. 1a and 1b may be formed on the basis of the following processes.

The general geometric configuration of the electronic fuse 150 may be defined by appropriately forming the isolation structure 103 within the semiconductor base material 102. To this end, any well-established process techniques for forming shallow trench isolations may be applied, which may include sophisticated deposition, lithography, patterning and trench fill techniques, followed by the removal of any excess materials. At any further advanced manufacturing stage, for instance prior to, during or after forming other circuit elements, such as transistors, a recess or cavity may be formed in the semiconductor base material 102, which may be accomplished on the basis of lithography techniques for providing an etch mask in combination with an anisotropic etch technique. It should be appreciated that a plurality of well-established etch recipes are available for etching, for instance, silicon material selectively with respect to other materials, such as silicon nitride, silicon dioxide, polymer materials and the like. For example, by appropriately designing the layout of the isolation structure 103, an appropriate etch mask may cover the contact regions 151,152, while any exposed portions of the isolation structure 103 may be used as a mask material for etching into the semiconductor base material 102 within the fuse body 153. Next, the material 154 may be deposited, for instance on the basis of selective epitaxial growth techniques, thereby providing the material 154 in a substantially crystalline state, wherein the deposition may be restricted to any exposed crystalline surface areas. To this end, in some illustrative embodiments, the same mask may be used as previously used for etching the corresponding cavity, when the mask material is appropriate for withstanding the high temperatures during the deposition of the material 154. For example, silicon nitride, silicon dioxide and the like may be efficiently used for this purpose.

Figure 1C:
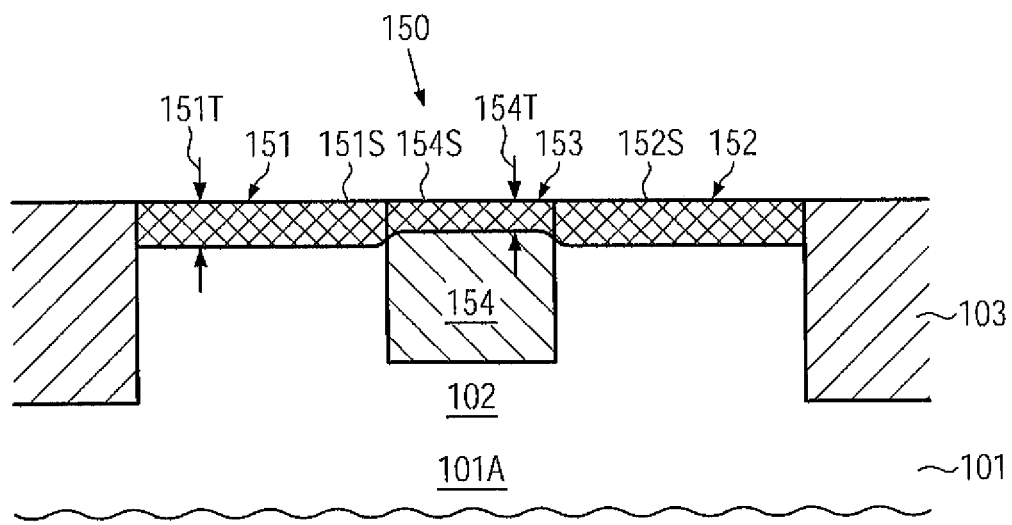
FIG. 1c schematically illustrates a cross-sectional view of the semiconductor device in a further advanced manufacturing stage, in which metal silicide of different thickness may be provided in the contact regions and the fuse body, according to illustrative embodiments.

FIG. 1*c* schematically illustrates the device 100 in a further advanced manufacturing stage. As shown, the electronic fuse 150 may comprise metal silicide portions 151S, 152S formed within the first and second contact regions 151, 152, respectively. Furthermore, a metal silicide 154S may be formed within the semiconductor material 154 having the reduced heat conductivity. As previously explained, the material 154 may have a reduced silicidation rate compared to the semiconductor base material 102 for otherwise given process conditions, so that the silicon/metal inter-diffusion during a corresponding silicidation process may be different in the contact regions 151,152 on the one hand and the semiconductor material 154 on the other hand. Consequently, an increased amount of metal silicide may be created in the contact regions 151,152, which may be desirable in view of obtaining a desired high drive current capability so as to efficiently contact the fuse body 153, in which the actual line degradation is to be initiated. For example, it is well known that the degree of metal silicide formation in silicon/germanium is significantly reduced compared to the silicide formation in a substantially pure silicon material. It should be appreciated that the term "pure" is to be understood so as to include any intentionally or unintentionally introduced impurities, such as certain dopant species and other process-related atomic species. For example, as shown in FIG. 1*c*, a thickness 151T of the metal silicide regions 151S, 152S in the contact regions 151, 152 may be greater by approximately 20-50% than a thickness 154T of the metal silicide region 154S in the material 154, when measured in a central area thereof.

The semiconductor device 100 as illustrated in FIG. 1*c* may be formed on the basis of any appropriate process strategy for forming a metal silicide. That is, at any appropriate manufacturing stage, a refractory metal, such as nickel, cobalt, platinum and the like, may be provided on the basis of well-established deposition techniques, and subsequently a heat treatment may be performed to initiate a chemical reaction with the silicon contained in the semiconductor base material 102 and in the material 154. Thereafter, any excess metal may be removed and any optional heat treatments may be performed to thermally stabilize the resulting metal silicide material. It should be appreciated that the metal silicide regions 151S, 152S, and in particular the metal silicide region 154S, may also comprise other metal/semiconductor compounds, such as a germanium/metal compound, which is also to be considered as being included in the term "metal silicide." It should be appreciated that the metal silicide in the electronic fuse 150 may be formed on the basis of a process strategy in which metal silicide may be concurrently provided in other circuit elements, such as in gate electrode structures of transistors, and other active regions, in and above which transistors may be provided, and the like.

As a consequence, the contact regions 151,152 may provide superior current drive capability, while the reduced amount of metal silicide 154S in the region 154 may result in a reduced amount of metal silicide that has to be displaced upon inducing significant electromigration. Moreover, the reduced thermal conductivity of the material 154 may at the same time cause a higher local temperature upon programming the electronic fuse 150, thereby even further contributing to superior reliability in programming the fuse 150 for a given current density.

Figure 1D:
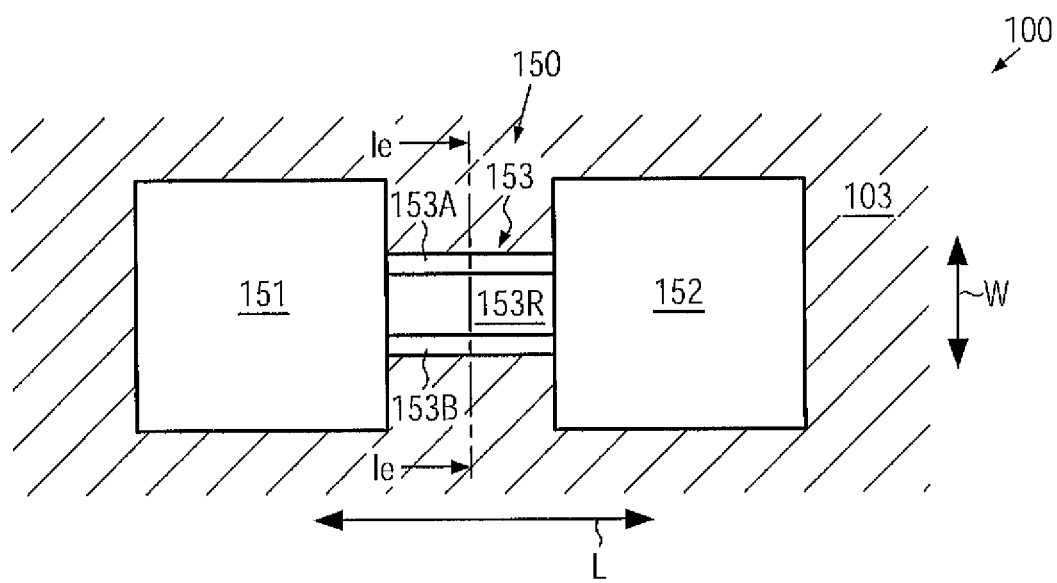
FIG. 1d schematically illustrates a top view of the electronic fuse, according to still further illustrative embodiments, in which sidewalls or delineation portions comprised of the semiconductor base material may be provided in the fuse body so as to provide superior growth conditions for forming the semiconductor material of reduced heat conductivity.

FIG. 1*d* schematically illustrates a top view of the semiconductor device 100 according to further illustrative embodiments. As illustrated, the isolation structure 103 may generally define the geometric layout of the electronic fuse 150, wherein, however, other than in the embodiments described above, the fuse body 153 may comprise sidewalls or delineation regions 153A,153B, which are comprised of the semiconductor base material. Thus, as shown in FIG. 1*d*, a recess or cavity 153R may be provided in the fuse body 153 and may thus laterally connect to the contact regions 151,152 in the length direction L and may be laterally delineated in a width direction, indicated as W, by the sidewalls or delineation regions 153A, 153B.

Figure 1E:
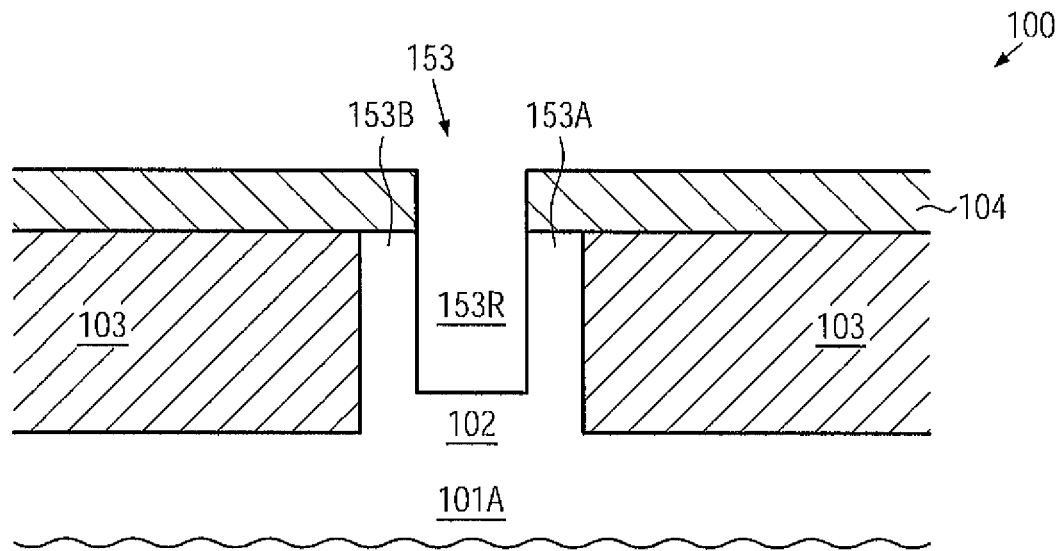
FIG. 1e schematically illustrates a cross-sectional view of the semiconductor device in a manufacturing stage comprising the recess or cavity in the fuse body.

FIG. 1*e* schematically illustrates a cross-sectional view of the semiconductor device 100 according to the line Ie of FIG. 1*d*. As shown, the recess or cavity 153R may be formed in the semiconductor base material 102 so as to extend to a desired depth, wherein sidewalls of the cavity 153R are represented by the regions 153B, 153A and are thus comprised of the base material 102. Moreover, a mask 104, such as silicon nitride, silicon dioxide and the like, may be provided so as to laterally define the position and size of the cavity 153R.

The semiconductor device 100 as illustrated in FIG. 1*e* may be formed on the basis of the following processes. After forming the isolation structure 103, as is also previously discussed, the mask 104 may be provided, for instance, in the form of one or more material layers, such as silicon dioxide, silicon nitride and the like, which may be subsequently patterned on the basis of appropriately selected lithography techniques in order to form an opening in the mask 104 that corresponds to the cavity 153R. Thus, the mask 104 in combination with the layout of the isolation structure 103 may define the delineation regions 153A, 153B with respect to their position and size according to the device requirements of the electronic fuse 150. Thereafter, an etch process may be applied for etching through the mask material on the basis of a resist mask and the like, for which a plurality of well-established etch recipes are available. Thereafter, the resist material may be removed or may be preserved and the etch process may be continued so as to etch into the base material 102, thereby forming the cavity or recess 153R. It should be appreciated that the etch process for forming the cavity 153R may cause certain variations in depth depending, for instance, on the local conditions during the etch process and the like. In order to reduce any negative effect of a varying etch depth for a plurality of recesses 153R during the further processing, the sidewalls 153A, 153B comprised of the base material 102 may be provided so as to at least partially compensate for any such process non-uniformities upon refilling the cavity 153R by a desired semiconductor material. That is, during a subsequent epitaxial growth process or any other deposition process, the fill behavior may not only depend on the depth of the cavity 153R and the growth rate of any material formed on the bottom of the base material 102, when the width of the cavity 153R is defined by the isolation structure 103 as previously discussed, but also the delineation regions 153A, 153B may influence the overall deposition rate, thereby significantly reducing any differences in the depth of the cavities 153R of electronic fuses.

Figure 1F:
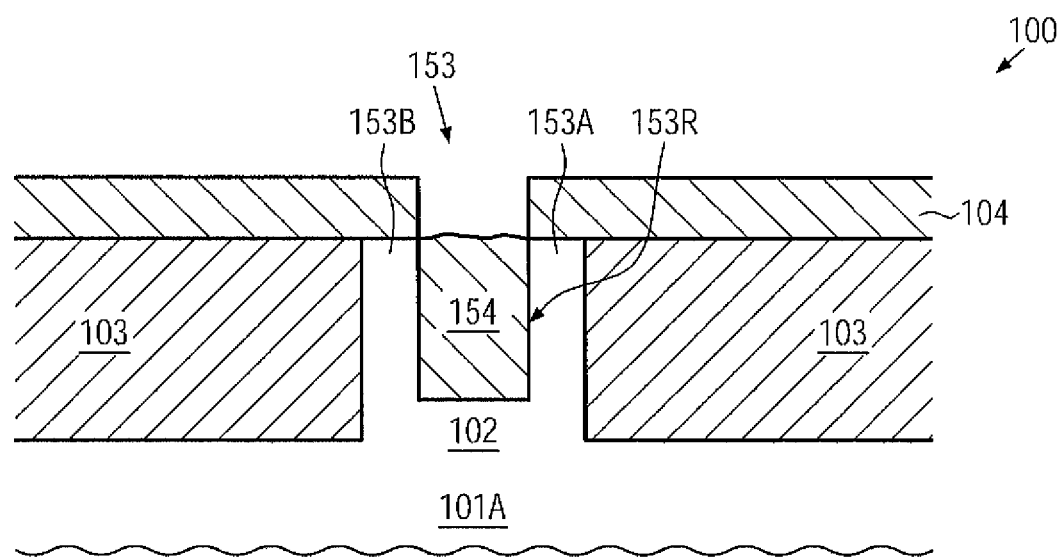
FIG. 1f schematically illustrates the device in a further advanced manufacturing stage, when the semiconductor material of reduced heat conductivity may be formed on the basis of delineation regions, according to illustrative embodiments.

FIG. 1f schematically illustrates the semiconductor device 100 in a further advanced manufacturing stage, wherein material 154 may be formed in the cavity 153R, for instance, on the basis of a selective epitaxial growth process. The deposition process may be performed on the basis of the mask 104, which may thus also act as a deposition mask. Moreover, the material 154 may be formed with superior uniformity within the cavity 153R due to the presence of the delineation regions or sidewalls 153A, 153B. In particular, the surface characteristics, i.e., the topography of the material 154, the shape thereof and the like, may be influenced by the regions 153A, 153B and may thus reduce any influence of etch depth variations, as discussed above. Moreover, the isolation structure 103 may be masked with respect to material erosion, as may otherwise be caused upon forming recesses in the base material 102 by using the isolation structure 103 as an etch mask, and hence this effect may be avoided or at least reduced, thereby also contributing to superior surface characteristics of the material 154, in particular in view of the further processing, for instance when forming a metal silicide therein.

It should be appreciated that the semiconductor material 154 may be formed on the basis of any well-established selective epitaxial growth techniques, for instance for forming a silicon/germanium alloy and the like, wherein, in some illustrative embodiments, a silicon/germanium material may also be formed in other devices areas, such as active regions of transistors, if required.

Figure 1G:
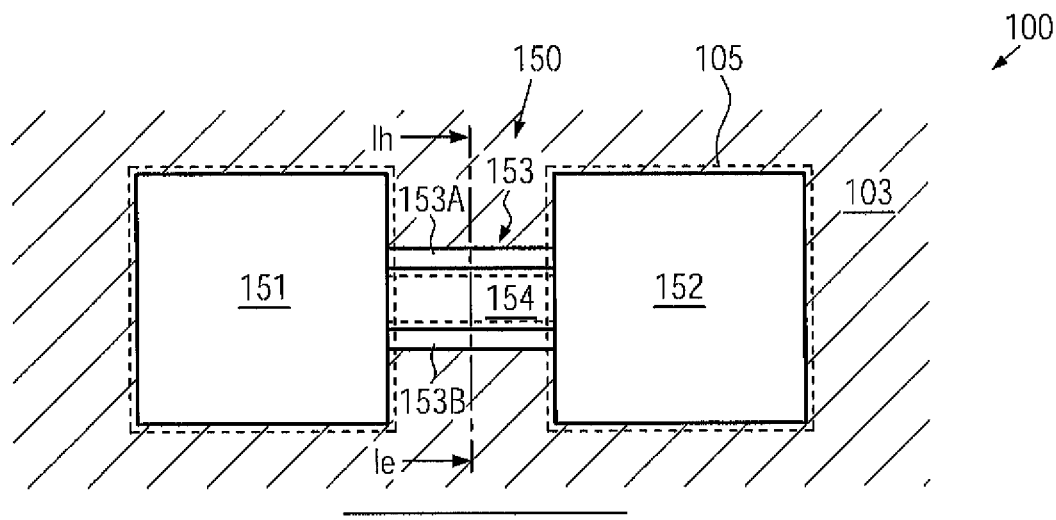
FIGS. 1g and 1h schematically illustrate a top view and a cross-sectional view, respectively, in which the silicidation may be restricted to the semiconductor material of reduced heat conductivity on the basis of a silicidation mask, according to illustrative embodiments.

FIG. 1g schematically illustrates the device 100 in a further advanced manufacturing stage, in which a mask 105 may be provided so as to define the lateral size and position of areas of the electronic fuse 150 in which a metal silicide is to be provided. As illustrated in FIG. 1g, the mask 105, which may be comprised of any appropriate material, may at least cover the delineation regions 153A, 153B, thereby substantially avoiding the formation of any metal silicide therein.

Figure 1H:
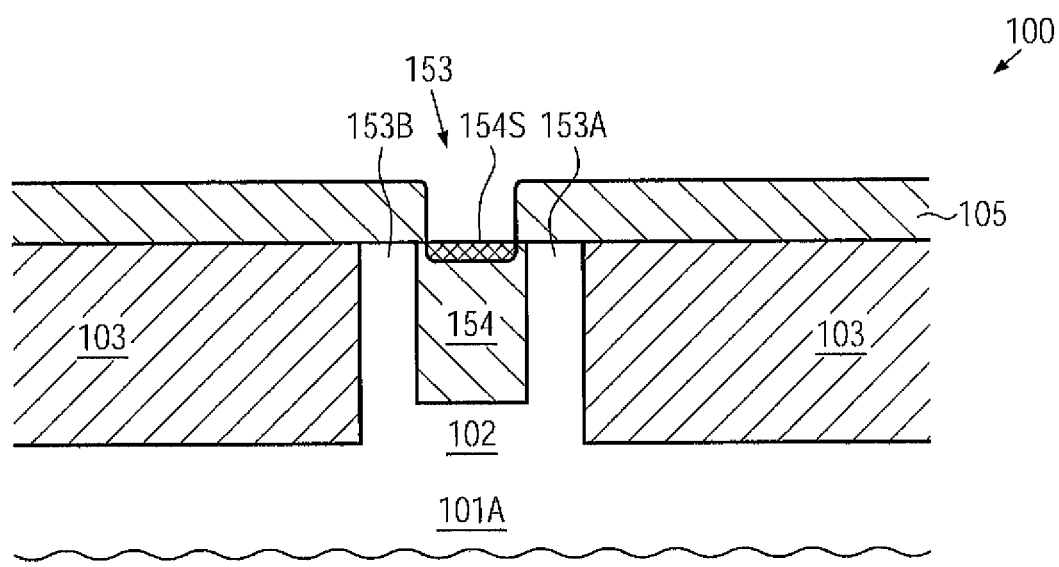

FIG. 1h schematically illustrates a cross-sectional view of the device 100 along the line Ih as shown in FIG. 1g. As illustrated, the mask 105 may cover at least the delineation regions 153A, 153B, while at least a portion of the material 154, and also at least a portion of the contact regions 151,152 (FIG. 1g) may be exposed. In the embodiments shown, the mask 105 may also cover a portion of the semiconductor material 154 so as to substantially completely position the metal silicide 154S within the material 154. The mask 105 may be formed by depositing any appropriate material or materials, such as silicon nitride and the like, and patterning the material layer in order to appropriately define the lateral position and size of the metal silicide region 154S within the fuse body 153, wherein at least the portions 153A, 153B may be covered by the mask 105. Thereafter, any appropriate silicidation process may be applied, as is also previously explained, thereby forming the material 154S in the fuse body 153 and also forming metal silicide in the contact regions 151, 152 (FIG. 1g). Consequently, due to the superior surface characteristics of the material 154 due to the presence of the portions 153A, 153B, as previously explained, the material 154S may be provided with superior uniformity, thereby also improving uniformity of the electronic characteristics of the electronic fuses to be provided in the semiconductor device 100.

Figure 1I:
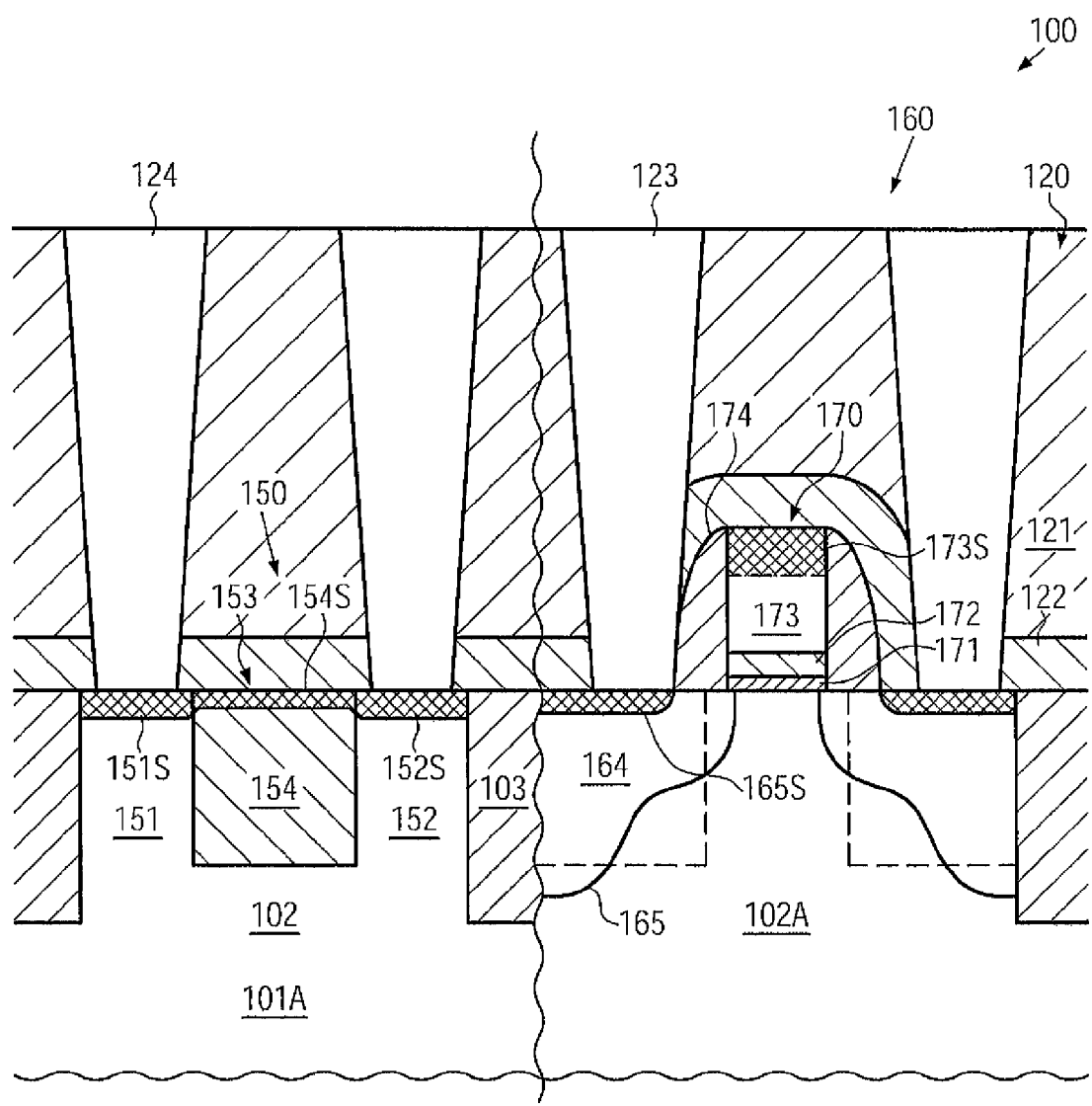
FIG. 1i schematically illustrates a cross-sectional view of the semiconductor device in which an electronic fuse and a sophisticated transistor may be provided, wherein the transistor may comprise a gate electrode structure formed on the basis of a high-k gate dielectric material and a metal-containing electrode material, according to illustrative embodiments.

FIG. 1i schematically illustrates the semiconductor device 100 in a further advanced manufacturing stage. As illustrated, a contact level 120 may be provided above the semiconductor base material 102 and may comprise any appropriate material or materials in order to enclose and thus passivate any circuit elements formed in and above the base material 102, such as the electronic fuse 150 and a transistor 160. The contact level 120 may comprise a dielectric material 122, such as silicon nitride material and the like, in combination with a further dielectric material, which may also be referred to as an interlayer dielectric material 121, which may be provided in the form of a silicon dioxide material and the like. Moreover, contact elements 124, 123 may be provided in the contact level 120 and may connect to the electronic fuse 150 and the transistor 160, respectively. The contact elements 123, 124 may be comprised of any appropriate conductive material, such as tungsten, aluminum, copper and the like, possibly in combination with an appropriate barrier material. Thus, the contact elements 124 may efficiently connect to the contact regions 151, 152 of the electronic fuse 150, wherein the superior heat conductivity and the increased amount of metal silicide 151S, 152S may provide high drive current capability. On the other hand, the thermal decoupling from the base material 102 achieved by the semiconductor material 154 in combination with the reduced amount of metal silicide 154S may result in superior reliability for programming the electronic fuse 150 for given programming conditions and a given configuration of the fuse 150.

The transistor 160 may be formed in and above an active region 102A, which may represent a portion of the semiconductor base material 102, which may be laterally delineated by the isolation structure 103. The transistor 160 may comprise drain and source regions 165, which in turn may include appropriate metal silicide regions 165S, if required. Furthermore, as illustrated in dashed lines, a performance enhancing semiconductor material 164, for instance in the form of a strain-inducing semiconductor material, may be provided in the active region 102A so as to locally increase charge carrier mobility. It is well known that strain may significantly modify the charge carrier mobility in a silicon material, thereby also enhancing drive current capability and thus overall performance of transistors. For example, in some illustrative embodiments, the semiconductor material 164 may represent the same type of material as the material 154, such as a silicon/germanium material, wherein the materials 154, 164 may be formed, in some illustrative embodiments, during a common selective epitaxial growth process.

Moreover, the transistor 160 may comprise a gate electrode structure 170, which, in some illustrative embodiments, may comprise a gate dielectric layer 171 in combination with at least one electrode material 173, wherein, for example, the dielectric material 171 may represent a conventional dielectric material in the form of silicon dioxide, nitride and the like, while the electrode material 173 may be provided in the form of a polysilicon material, a silicon/germanium material and the like. Moreover, in this case, a metal silicide material 173S may also be formed in the electrode material 173. In other illustrative embodiments, as previously discussed, the gate electrode structure 170 may represent a sophisticated high-k metal gate electrode structure, wherein the gate dielectric material 171 may comprise a high-k dielectric material, for instance in the form of hafnium oxide based material, zirconium based materials and the like. In this case, at least one metal-containing electrode material may be provided, as is for instance shown as a layer 172, in order to obtain a desired work function and superior conductivity of the gate electrode structure 170. It should be appreciated that, in some approaches, in addition to the metal-containing electrode material 172, the material 173 may be provided, for instance, in the form of a semiconductor material, possibly in combination with the metal silicide material 173S, while, in other cases, a further metal-containing electrode material may be provided for the material 173, for instance in the form of aluminum and the like. In this case, the metal silicide 173S may be omitted. Moreover, the gate electrode structure 170 may comprise a sidewall spacer structure 174, which may have any appropriate configuration as demanded by process and device requirements.

The semiconductor device 100 as illustrated in FIG. 1i may be formed on the basis of any appropriate processor strategy. That is, the electronic fuse 150 may be formed on the basis of process techniques as also descried above, wherein, at any appropriate stage, the transistor 160 or certain components thereof may be provided. To this end, the gate electrode structure 170 may be formed, for instance, prior to or after the provision of the material 154 in the electronic fuse 150 by sophisticated process techniques. For example in some illustrative embodiments, the gate dielectric material 171 including a high-k dielectric material in combination with the metal-containing electrode material 172 may be provided in an early manufacturing stage, followed by a semiconductor material, such as silicon, wherein the resulting layers may then be patterned in accordance with sophisticated patterning regimes. Thereafter, the drain and source regions 165 in combination with the spacer structure 174 may be provided and, after any high temperature anneal processes, the metal silicide 165S and 173S may be formed, together with the metal silicide materials 151S, 152S and 154S in the electronic fuse 150. Thereafter, the contact level 120 may be formed on the basis of any well-established process strategies by depositing the materials 122, 121, patterning the same and filling the resulting openings with any appropriate contact metal.

In other approaches, as is also discussed above, a replacement gate approach may be applied, in which a portion of the gate electrode structure 170, for instance a semiconductor material, for instance in the form of the material 173, may be replaced by any appropriate metal-containing electrode material, wherein, in some embodiments, a high-k dielectric material may also be provided in this late manufacturing stage. The replacement gate approach may be applied after forming at least a portion of the contact level 120 and exposing a top surface of the gate electrode structure 170 in order to remove any undesired gate materials and replacing the same with at least a metal-containing electrode material.

As a result, semiconductor-based electronic fuses, such as the fuse 150, may be formed in the semiconductor base material by using compact and efficient layouts, which may be accomplished by replacing a portion of the semiconductor base material with a semiconductor material of reduced heat conductivity selectively in the fuse body of the electronic fuse. Furthermore, in some illustrative embodiments, superior surface conditions during the formation of a metal silicide in the semiconductor material of reduced heat conductivity may be accomplished by providing sidewalls or delineation regions comprised of the semiconductor base material upon forming the cavity in the fuse body so that superior uniformity of the resulting metal silicide may also be achieved. Consequently, compact layouts for electronic fuses may be advantageously applied to bulk semiconductor architectures, while at the same time providing superior programming reliability, without requiring undue high current densities. Therefore, semiconductor-based electronic fuses in bulk semiconductor devices may be combined with any complex transistor structures, such as transistors comprising high-k metal gate electrode structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an electronic fuse of a semiconductor device, the method comprising:
    forming a fuse body of said electronic fuse by replacing a portion of a first semiconductor material with a second semiconductor material, said first semiconductor material forming a bulk configuration with a substrate material of said semiconductor device, said first semiconductor material having a first heat conductivity that is greater than a second heat conductivity of said second semiconductor material;
    forming a contact region of said electronic fuse laterally adjacent to and in contact with said fuse body in said first semiconductor material; and
    forming a metal silicide material of said fuse body locally restricted in said second semiconductor material.

2. The method of claim 1, wherein replacing a portion of a first semiconductor material with a second semiconductor material comprises forming a recess in a silicon-containing base layer and filling said recess with a silicon-containing semiconductor material.

3. The method of claim 2, wherein forming said recess in said silicon-containing base layer comprises forming an isolation structure and using said isolation structure as sidewalls of said recess.

4. The method of claim 2, wherein forming said recess in a silicon-containing base layer comprises forming an isolation structure in said silicon-containing base layer and forming said recess laterally between said isolation structure so as to preserve portions of said silicon-containing base layer as sidewalls of said recess.

5. The method of claim 1, wherein said second semiconductor material comprises a silicon/germanium mixture.

6. The method of claim 1, further comprising forming a metal silicide in said contact region.

7. The method of claim 6, wherein forming said contact region comprises forming said contact region so as to have a greater width than said fuse body.

8. The method of claim 7, further comprising forming a second contact region so as to be in contact with said fuse body, wherein said second contact region has an increased width compared to said fuse body.

9. A method of forming a semiconductor device, the method comprising:
forming an isolation structure in a semiconductor base material so as to laterally delineate a first contact region and a second contact region of an electronic fuse in said semiconductor base material, said semiconductor base material forming a bulk configuration with a substrate material of said semiconductor device;
forming a recess in said semiconductor base material between said first and second contact regions;
forming a silicon-containing semiconductor material in said recess, said silicon-containing semiconductor material having a reduced heat conductivity compared to said semiconductor base material; and
forming a metal silicide material in said first and second contact regions and said silicon-containing semiconductor material.

10. The method of claim 9, wherein forming said recess in said semiconductor base material comprises preserving a portion of said semiconductor base material so as to form sidewalls of said recess.

11. The method of claim 10, wherein forming said metal silicide comprises masking said preserved portions of said semiconductor base material and forming said metal silicide in said silicon-containing semiconductor material and said first and second contact regions.

12. The method of claim 9, wherein forming said silicon-containing semiconductor material comprises forming said silicon-containing semiconductor material so as to have a reduced silicidation rate compared to said semiconductor base material.

13. The method of claim 9, wherein forming said silicon-containing semiconductor material comprises forming said silicon-containing semiconductor material in said recess and in cavities formed in an active region of a transistor by performing a common deposition process.

14. The method of claim 9, further comprising forming a gate electrode structure above an active region of said semiconductor device and replacing at least a portion of said gate electrode structure by a metal-containing electrode material.

15. The method of claim 9, wherein said silicon-containing semiconductor material comprises a silicon/germanium mixture.

16. A semiconductor device, comprising:
first and second contact regions of an electronic fuse formed in a semiconductor base material and laterally delineated by an isolation structure, said semiconductor base material having a first heat conductivity and forming a bulk configuration with a crystalline substrate material of said semiconductor device;
a fuse body in contact with said first and second contact regions, said fuse body comprising a silicon-containing semiconductor material having a second heat conductivity that is less than said first heat conductivity;
delineation regions comprised of said semiconductor base material and formed laterally adjacent to said fuse body so as to laterally enclose said fuse body; and
a metal silicide formed selectively in said first and second contact regions and in said silicon-containing semiconductor material of said fuse body.

17. The semiconductor device of claim 16, wherein said semiconductor base material comprises silicon and said silicon-containing semiconductor material comprises a silicon/germanium mixture.

18. The semiconductor device of claim 17, wherein a width of each of said delineation regions is less than a width of said fuse body.

19. The semiconductor device of claim 16, wherein said metal silicide is formed laterally completely within said silicon-containing semiconductor material.

20. The semiconductor device of claim 16, further comprising a transistor formed in and above a semiconductor region, wherein said transistor comprises a gate electrode structure comprising a high-k dielectric material and a metal-containing electrode material.

* * * * *